(12) United States Patent
Kim et al.

(10) Patent No.: US 7,511,308 B2
(45) Date of Patent: Mar. 31, 2009

(54) LIGHT EMITTING DEVICE AND METHOD FOR FABRICATING THE SAME

(75) Inventors: Jong Wook Kim, Seongnam-si (KR); Hyun Kyong Cho, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 40 days.

(21) Appl. No.: 11/526,883

(22) Filed: Sep. 26, 2006

(65) Prior Publication Data

US 2007/0126013 A1    Jun. 7, 2007

(30) Foreign Application Priority Data

Sep. 27, 2005    (KR) ...................... 10-2005-0089946

(51) Int. Cl.
*H01L 33/00*    (2006.01)

(52) U.S. Cl. ................... 257/79; 257/94; 257/E33.005; 257/E33.006; 257/E33.064

(58) Field of Classification Search ................... 257/79, 257/94, E33.005, E33.006, E33.064
See application file for complete search history.

(56) References Cited

U.S. PATENT DOCUMENTS 7,250,635 B2 *   7/2007   Lee et al. ....................... 257/98
7,279,718 B2 *   10/2007  Krames et al. ................. 257/98

* cited by examiner

*Primary Examiner*—Victor A Mandala
(74) *Attorney, Agent, or Firm*—McKenna Long & Aldridge LLP

(57) ABSTRACT

A light emitting device and a method for fabricating the same are disclosed, whereby a thin mask film is changed to agglomerates by a simple thermal treatment process, and a plurality of nano openings, each opening spaced a distance apart, are formed in the agglomerates, a light emitting structure exposed to the nano openings is etched to form nano grooves and nano openings therein, enabling to enhance a light emitting area and to reduce the totally reflected light for an improvement of the light extraction efficiency.

8 Claims, 13 Drawing Sheets

FIG. 1

PRIOR ART

LIGHT EMITTING DEVICE AND METHOD FOR FABRICATING THE SAME

This application claims the benefit of Korean Patent Application No. 10-2005-0089946, filed on Sep. 27, 2005, which is hereby incorporated by reference for all purposes as if fully set forth herein.

BACKGROUND

This description relates to a light emitting device and a method for fabricating the same. Typically, a light emitting device is a light source having one wavelength for various applications in, for example, a light source and a display.

Most of the lights generated from inside of the light emitting device are trapped within the light emitting device by reflection from an interface between the two materials such as a semiconductor and air beyond a critical angle. In other words, light that reaches the surface beyond the critical angle will not cross but will experience a total internal reflection (TIR).

Figure 1:
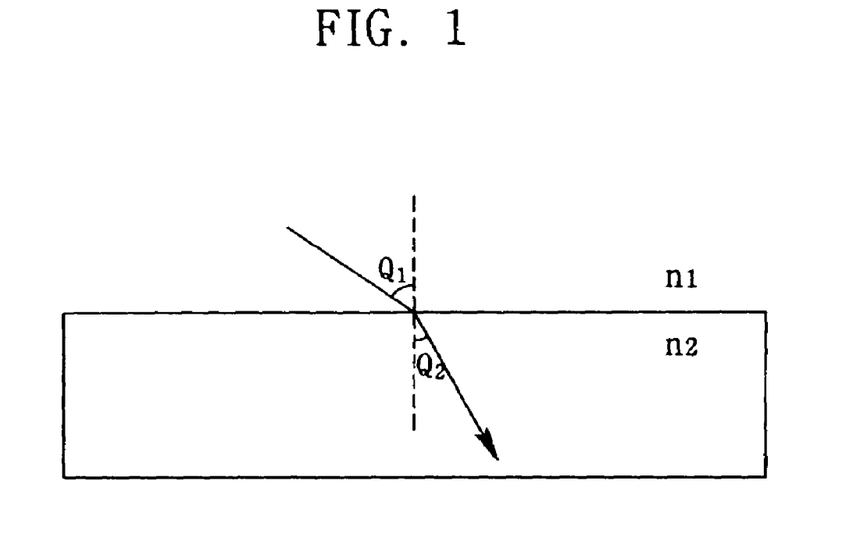
FIG. 1 is a conceptual drawing illustrating a light path formed by a difference of index of refraction between two materials according to prior art.

Referring to FIG. 1 which is a conceptual drawing illustrating a light path formed by a difference of index of refraction between two materials according to prior art.

According to Snell's law of Equation 1, when a light is directed from one material with an index of refraction n1 towards another material with an index of refraction n2, the light will be refracted if its incident angle is smaller than a critical angle. Otherwise, the light will be totally reflected from an interface between the two materials beyond a critical angle.

$$n1*\sin \theta 1 = n2*\sin \theta 2 \qquad \text{Equation 1}$$

where, θ1 is an incident angle while θ2 is a refraction angle.

Figure 2:
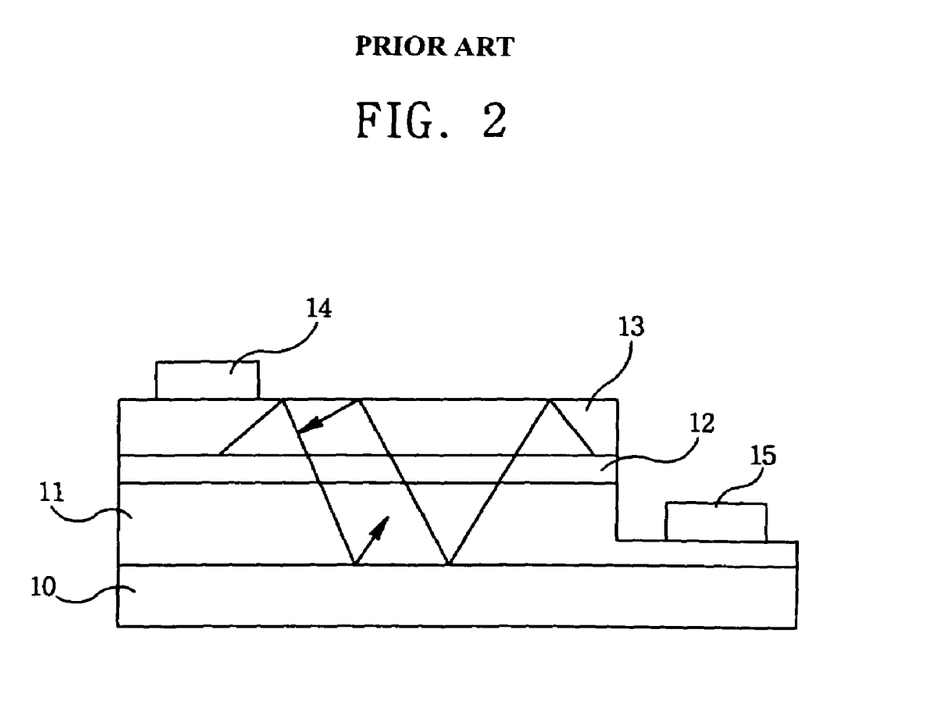
FIG. 2 is a schematic cross-sectional view illustrating a light path in a light emitting device according to the prior art.

FIG. 2 is a schematic cross-sectional view illustrating a light path in a light emitting device according to the prior art. The light emitting device sequentially from bottom to top includes a substrate (10), an N-semiconductor layer (11), an active layer (12) and a P-semiconductor layer (13), where lights (a,b,c) traveling to the outside of the device at an angle less than a critical angle out of lights emitted from the active layer (12) will cross, while light (d) that reaches the outside of the device beyond the critical angle will not cross but will be trapped inside the device and experience total internal reflection (TIR).

As a result, if quantum being trapped in the light emitting device increases, an output of light from the light emitting device decreases, degrading its efficiency. There are several approaches for improving light extraction efficiency from the light emitting device.

In one approach to improving the light extraction efficiency, light emitting devices are ground into hemispherical shapes. In other words, a light emitting surface of the light emitting device is shaped into a hemisphere with an emitting layer at the center. Light emitted from a point in the active region of a hemispherically shaped light emitting device intersects the hemispherical interface at near normal incidence. Thus, total internal reflection is reduced. However, this technique, although it is one of the best optical choices, is tedious and wasteful of material. In addition, defects introduced during the grinding process may compromise the reliability and performance of the light emitting devices.

In another approach, light emitting devices are encapsulated (encased) in a material with a dome or hemispherically shaped surface, although it is very difficult to manufacture. In still another approach, a substrate re-absorbing light emitted from the light emitting devices is changed to a substrate for total reflection.

In a different approach, a light emitting device having a micro cavity structure or a resonant cavity structure is disclosed. But this approach requires a very precise controllability and reproducibility relative to thickness of the structural layers during the fabrication process, and if the light is to be effectively extracted from semiconductors to air, this approach has a shortcoming in that the emitting wavelengths of the light emitting device should accurately match the fabricated cavity mode. Another shortcoming is that the emitting wavelengths of the light emitting device vary to drastically reduce the light extraction if temperatures or operating currents increase.

Recently, as a means to reduce TIR and improve overall light extraction, one of the more popular approach is developed which is a surface texturing. The surface texturing technique is to roughen a surface of a light emitting device chip from which light generated thereinside is artificially emitted or to include a periodic pattern of the emitting surface.

The approach of the surface texturing technique known to enhance the light extracting efficiency from the light emitting device chip can be used individually, or can be applied in association with the known techniques such as the chip shape-changed technique, the epoxy encapsulation and the substrate change approach. The surface texturing approach has been shown to improve light emission efficiency to a great extent.

The current surface texturing is patterned into the light emitting device surface as a mask during a dry or wet etching. One shortcoming of the surface texturing is that height of the surface shape is limited due to a predetermined thickness of each structural layer, and a very accurate controllability and reproducibility relative to thickness of the structural layers during the etching process, is required. Another shortcoming is that many processes including pattern forming and the like for etching are required.

There has been recently a great deal of heightened interest and development in light emitting devices of Group-III nitride based material systems having wide band gaps by which nitride based semiconductor growth structure or grown epitaxial fabricating process is improved to thereby enhance the photo conversion efficiency.

For example, light emitting devices employing semiconductor nano structures such as nanorod and nanowire can alleviate stress over the conventional thin-film semiconductors to enable to enhance the internal quantum efficiency and to structurally improve the light extraction efficiency.

The method for forming a nano structure can be categorized into two types, that is, a process for growing a nano structure, and a process for realizing a nano structure by patterning the conventional thin-film epitaxial wafer and etching the same.

Many techniques are developed and performed by research institutes for using metal as catalyst or growing GaN nanorod and nanowire without using catalyst. However, there is a shortcoming in the growing process thus explained in that it is difficult to grow an epitaxial layer of a device having a nano structure and it is difficult to have a reproducible nano structure shape having a predetermined length and thickness.

Another shortcoming is that a nano structure manufacturing method using semiconductor processing technology (e.g., photolithography technology) is, however, associated with the problems of poor manufacture yield and high system cost, although light extraction efficiency has been improved and the internal efficiency has been enhanced through the alleviation of stress by manufacturing of micro LED and nanorod LED by etching a sample with a patterned surface via the photolithography technology.

SUMMARY

Briefly, and in general terms, the instant invention is directed to solve the aforementioned shortcomings and one object is to provide a light emitting device and a method for fabricating the same wherein a thin film layer as a mask (hereinafter referred to as thin mask film) is changed into agglomerates through a simple thermal treatment process, and a plurality of discrete nano opneings are formed between the agglomerates each nano opening spaced a predetermined distance apart, and a light emitting structure exposed to the nano openings is etched to form nano openings and nano grooves in the light emitting structure, thereby increasing a light emitting area and enhancing the light extraction efficiency by reducing. the totally reflected light.

Another object is to fill insulating filler into nano holes and nano openings enabling to stabilize the device structure and to enhance the reliability of the device.

In one general aspect, a light emitting device comprises: a substrate; a first layer having a first polarity, formed on the substrate, with part of the first layer being removed and a plurality of nano grooves formed at an area of the first layer not removed; an active layer formed on the first layer not removed, and formed with nano openings communicating with the nano grooves; a second layer formed on the active layer and having a reverse polarity from that of the first layer, and formed with nano openings communicating with the nano openings; a first electrode formed on the second layer; and a second electrode formed on the first layer that is removed.

In another general aspect, a light emitting device comprises: a supporter; a first layer having a first polarity, formed on the supporter, and with a plurality of nano grooves; an active layer formed on the first layer and having nano openings, each opening communicating with the plurality of nano grooves; a second layer having a polarity reverse of the first polarity, the second layer formed on the active layer and having nano openings, each opening communicating with the nano openings of the active layer; and an electrode formed on the second layer.

In still another general aspect, a method for fabricating a light emitting device, comprising: laminating on a substrate a first layer having a first polarity, an active layer, a second layer having a polarity reverse of the first polarity and a protective layer; forming a thin mask film at part of an upper area at the protective layer; performing a heat treatment process on the thin mask film to form on the thin mask film a plurality of nano openings, each opening spaced at a distance apart; etching a protective layer corresponding to an area exposed to the plurality of nano openings and corresponding to an area not formed with the thin mask film, the second layer, the active layer and part of the first layer by using the thin mask film as a mask; removing the thin mask film and the protective layer; and forming a first electrode on the second layer, and forming a second electrode on the etched first layer.

In still another general aspect, a method for fabricating a light emitting device, comprising: laminating on a substrate a first layer having a first polarity, an active layer, a second layer having a polarity reverse of the first polarity, and forming a supporter on the second layer; separating the substrate from a bottom of the first layer; forming a thin mask film at a bottom surface of the first layer; performing a heat treatment process to the thin mask film to form a plurality of nano openings, each opening spaced at a distance apart; etching from the first layer exposed to the plurality of nano openings to part of the second layer by using the thin mask film as a mask; and removing the thin mask film to form an electrode at a bottom surface of the first layer.

In still another general aspect, a method for fabricating a light emitting device, comprising: preparing a light emitting structure composed of a first layer, an active layer and a second layer; forming a metal thin film on the second layer of the light emitting structure; performing a thermal treatment on the metal thin film to form a plurality of agglomerates; and etching at least a part of the light emitting structure by using the plurality of agglomerates as a mask.

BRIEF DRAWINGS OF THE INVENTION

DETAILED DESCRIPTION

There will now be described in detail hereinafter preferred embodiments of the present invention with reference to the accompanying drawings.

Figure 3A:
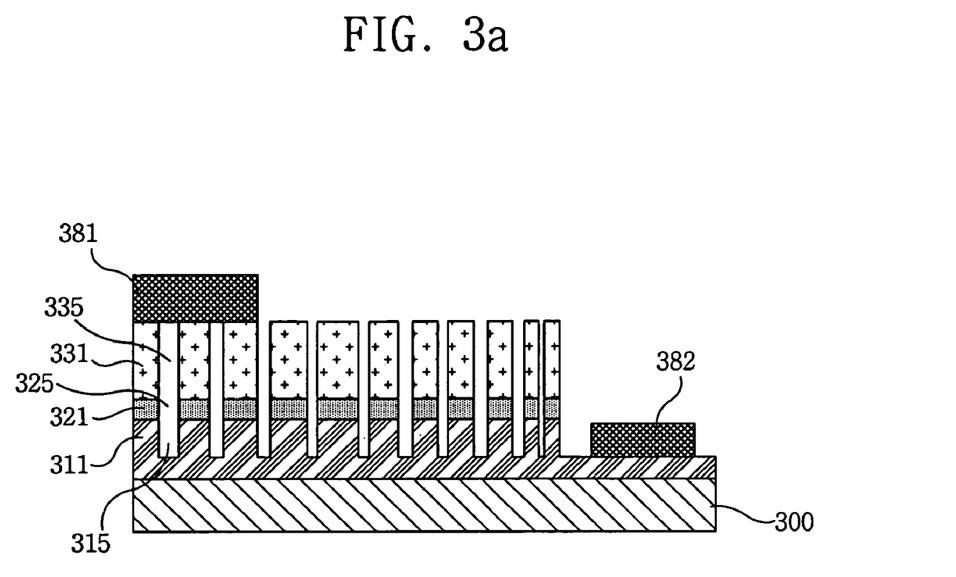
FIGS. 3a and 3b are schematic cross-sectional views of a light emitting device according to the present invention.
Figure 3B:
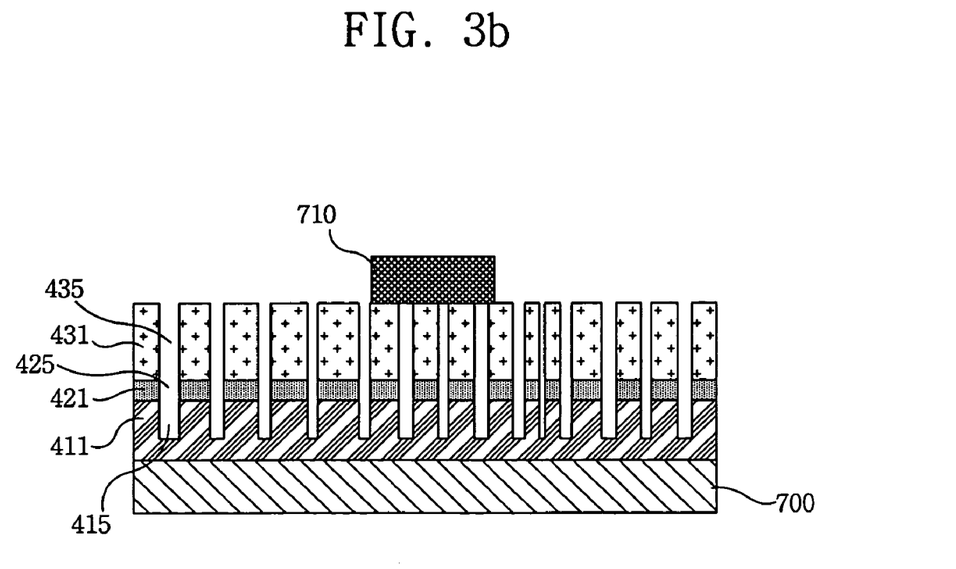

FIGS. 3a and 3b are schematic cross-sectional views of a light emitting device according to the present invention. Referring first to FIG. 3a, a light emitting device comprises: substrate (300); a first layer (311) having a first polarity, formed on the substrate (300), with a part of the first layer being removed and a plurality of nano grooves (315) formed at an area of the first layer not removed; an active layer (321) formed on the first layer (311) not removed; a second layer (331) formed on the active layer (321) and having a reverse polarity from that of the first layer (311); a first electrode (381) formed on the second layer (331); and a second electrode (382) formed on the first layer (311) that is removed.

The second layer (331) may further include thereon with a transparent electrode, and the first electrode may be formed on the transparent electrode. Preferably, the active layer (321), the second layer (331) and the transparent electrode are formed with a plurality of nano openings (325, 335), each opening communicating with a plurality of nano grooves (315) formed at the first layer (331). At this time, reference numerals of the nano openings formed at the transparent electrode are not given as the transparent electrode is not illustrated in FIG. 3a. An insulating filler filled in the nano openings and the nano holes may be further included, and the transparent electrode may be formed on the second layer (335) and the insulating filler. The first polarity is an N-type or a P-type. As noted above, nano grooves are formed in the light emitting device, and light emitted from the light emitting device is not totally reflected to enable to enhance the light extraction efficiency.

A light emitting device according to FIG. 3b comprises: a supporter (700); a first layer (411) formed on the supporter (700) and having a first polarity formed with a plurality of nano grooves (415); an active layer (421) formed on the first layer (411) and having nano openings (425), each opening communicating with the plurality of nano grooves (415); a second layer (431) formed on the active layer (421) and having nano openings (435), each opening communicating with the nano openings (425) of the active layer (421) and also having a polarity reverse of the first polarity; and an electrode (710) formed on the second layer (431).

The light emitting device may further include a transparent electrode between the second layer (431) and the electrode (710). Preferably, an insulating filler to be filled into the nano grooves (415) and the nano openings (425, 435) are further included. At this time, the insulating filler is preferred to be polyimide or spin-on glass (SOG). Preferably, the supporter (700) is conductive, and more preferably, the supporter (700) is a metal layer or a conductive substrate. Each width of the nano grooves in the light emitting device of FIGS. 3a and 3b is in the range of 1~1000 nm. Therefore, the light emitting device according to the present invention may be formed with nano openings even at the active layer, thereby enabling to enhance a light emitting area and to improve the light extraction efficiency.

FIGS. 4a to 4f are schematic cross-sectional views of fabricating process of a light emitting device according to a first embodiment of the present invention.

Figure 4A:
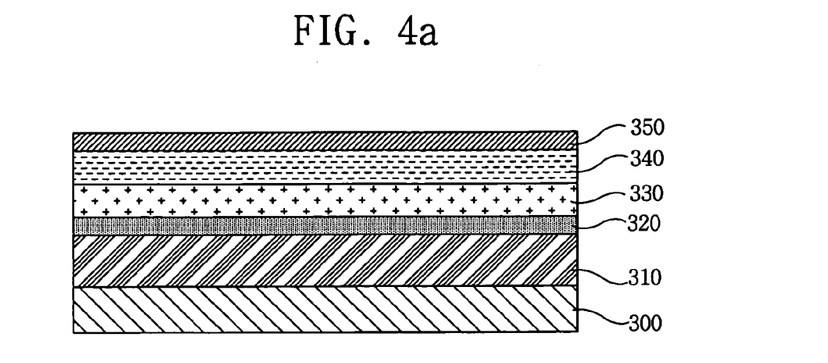
FIGS. 4a to 4f are schematic cross-sectional views of fabricating process of a light emitting device according to a first embodiment of the present invention.

First, a substrate (300) is sequentially laminated thereon with an N-type semiconductor layer (310), an active layer (320), a P-type semiconductor layer (330), a transparent layer (340) and a protective layer (350) (FIG. 4a).

There is an advantage in the protective layer (350) in that it can prevent a metal to be deposited in a process (described later) from being spread to an epitaxial layer of the device. Preferably, the protective layer (350) is a silicon oxide film.

Figure 4B:
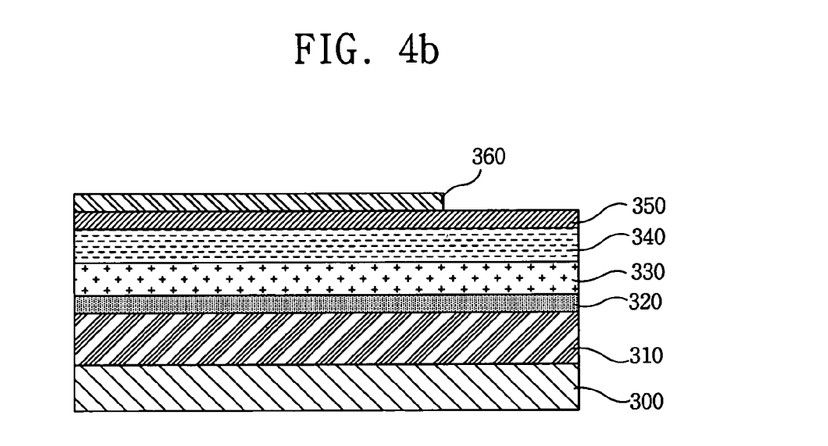

Successively, the protective layer (350) is partially formed with a thin mask film (360) at an upper surface thereof (FIG. 4b). The thin mask film (360) is preferably a metal thin film layer or a thin film layer containing a metal.

Figure 4C:
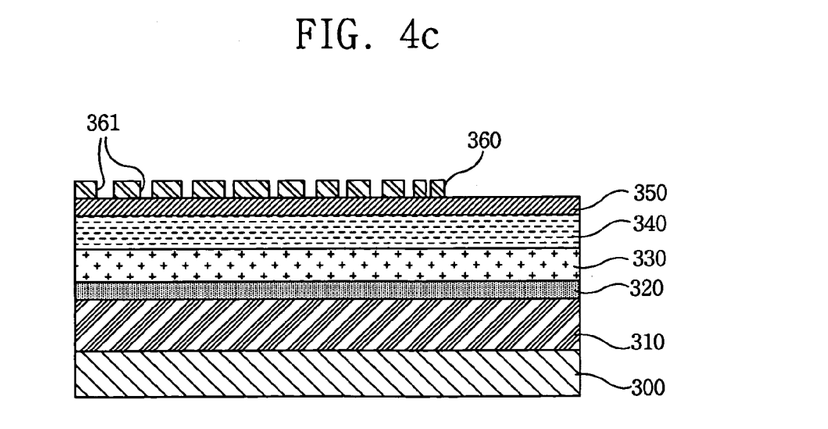

Thereafter, the thin mask film (360) is thermally treated to allow being formed thereon with a plurality of nano openings (361), each opening spaced a distance apart (FIG. 4c). If the thin mask film (360) is thermally treated, an interface of a part of the thin mask film (360) is separated from a layer existing thereunder, and the separated portions generate agglomerates in order to reach a stabilized state. The thin mask film (360) is formed with a plurality of nano openings, each opening spaced a distance apart the moment the agglomerates are generated.

In other words, in the thermal treatment process, the thin mask film is changed into agglomerates, and a plurality of nano openings, each opening spaced a distance apart, are formed in the agglomerates. Furthermore, the size and density of the plurality of nano openings (361) formed at the thin mask film (360) vary according to thickness of the thin mask film and condition in the thermal treatment process.

The thermal treatment process is performed at a temperature lower than that of the melting point of the thin mask film. For example, if the thin mask film (360) is made of Ag, the thermal treatment process is executed at a temperature lower than 961.9° C. which is the melting point.

At the same time, the thin mask film in the present invention can be completely melted through the thermal treatment process, cooled and formed into agglomerates.

Furthermore, each width of the nano openings is preferably in the range of 1~1000 nm, and each width of nano grooves (described later) is the same as that of each nano opening as the width of each nano groove is determined by that of each nano opening.

Figure 4D:
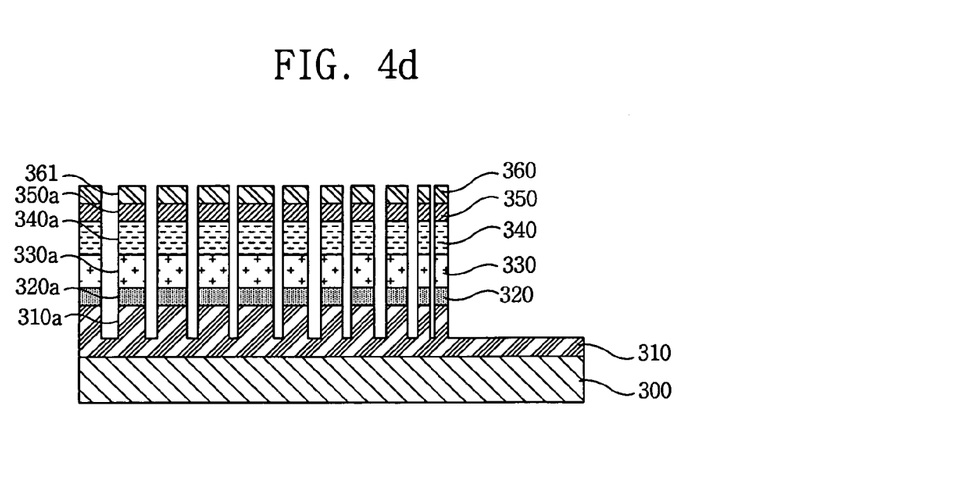

Successively, the protective layer (350), the transparent electrode (340), the P-type semiconductor layer (330) and the active layer (320) and part of the N-type semiconductor layer (310) corresponding to an area exposed to the plurality of nano openings (361) and corresponding to an area not formed with the thin mask film (360) are etched by using the thin mask film as a mask (FIG. 4d). The protective layer (350), the transparent electrode (340), the P-type semiconductor layer (330) and the active layer (320) are formed in the etching process with nano openings (320a, 330a, 340a, 350a), each opening communicating with the plurality of nano openings (361) formed at the thin mask film (360).

Figure 4E:
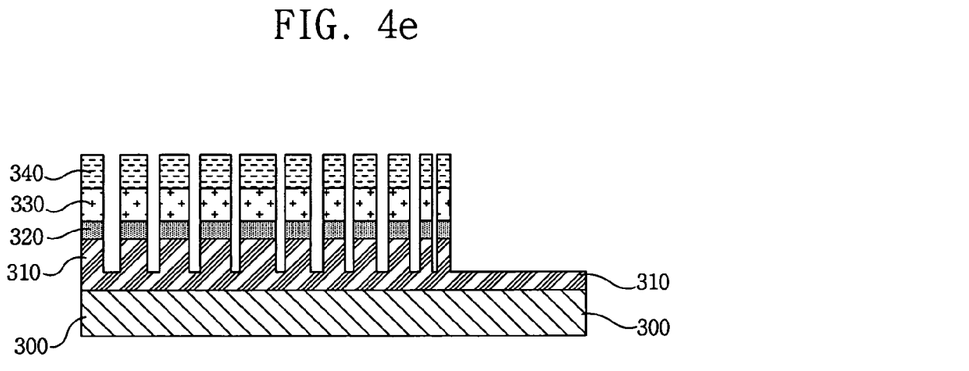
Figure 4F:
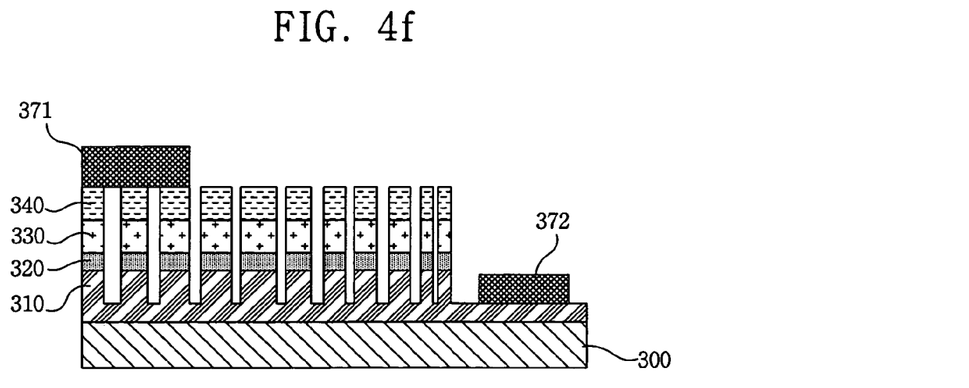

Furthermore, because the N-type semiconductor layer (310) is partially etched, nano grooves (310a) are formed thereat. Thereafter, the thin mask film (360) and the protective layer (350) are removed (FIG. 4e). Lastly, the transparent electrode (340) is formed thereon with a P-type electrode (371), and the etched N-type semiconductor layer (310) is formed thereon with an N-type electrode (372) (FIG. 4f).

As noted above, nano openings are formed on the thin mask film without recourse to a photolithographic process in the present invention, and a light emitting structure not formed with thin mask film is etched to allow nano grooves or nano openings to be formed thereon, enabling to effectively extract light emitted from an interior of a light emitting device.

Figure 5:
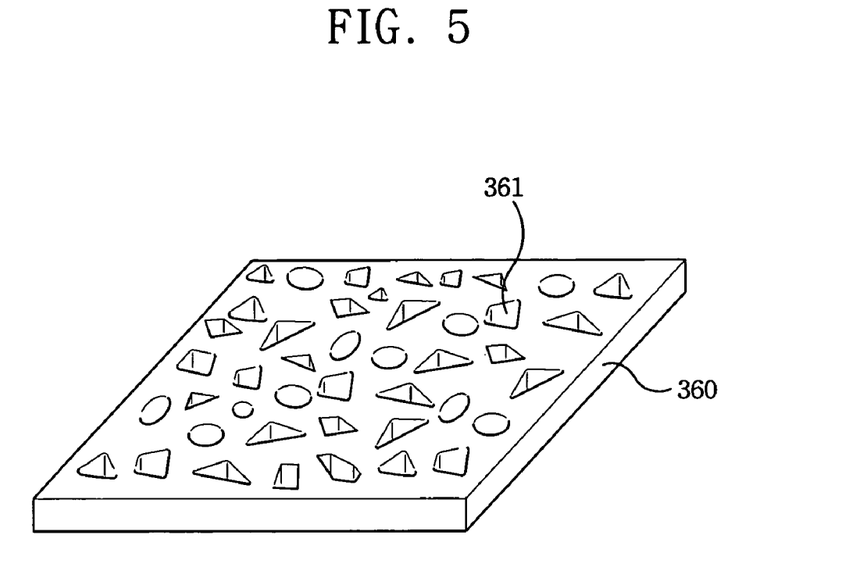
FIG. 5 is a partial perspective view schematically illustrating openings formed at a thin mask film according to the present invention.

FIG. 5 is a partial perspective view schematically illustrating nano openings (361) formed at a thin mask film according to the present invention. If thermal treatment process is performed on the thin mask film (360), the thin mask film (360) is formed thereon with a plurality of nano openings (361), each opening spaced a distance apart.

Figure 6:
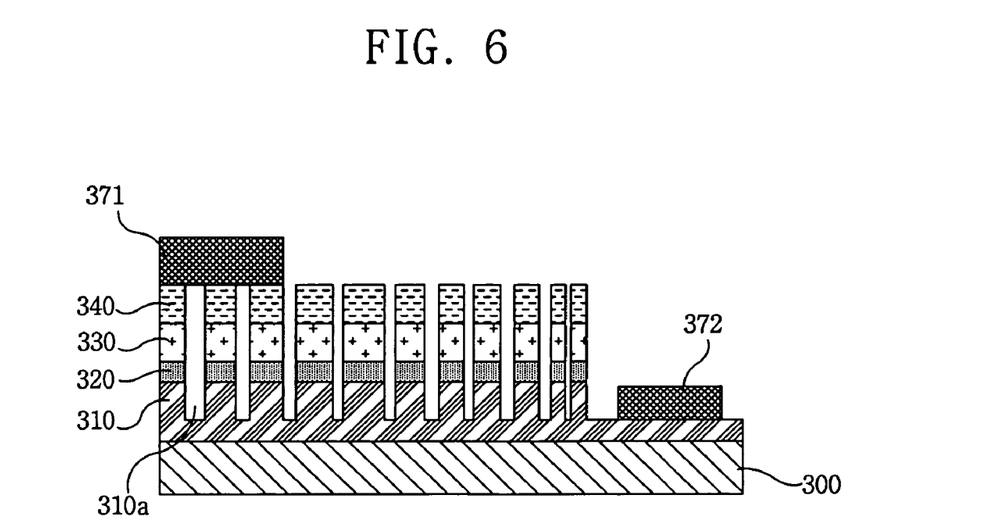
FIG. 6 is a schematic cross-sectional view illustrating a light emitting device according to the first embodiment of the present invention.

FIG. 6 is a schematic cross-sectional view illustrating a light emitting device according to the first embodiment of the present invention.

The light emitting device comprises: a substrate (300); an N-type semiconductor layer (310) formed on the substrate (300) and having part of an area being removed and a plurality of nano grooves (310a) formed at an area not removed; an active layer (320) formed on the N-type semiconductor layer (310) not removed; a P-type semiconductor layer (330) formed on the active layer (320); a transparent electrode (340) formed on the P-type semiconductor layer (330); and a P-type electrode (371) formed on the transparent electrode (340); and N-type electrode (372) formed on the removed N-type semiconductor layer (310).

Preferably, the active layer (320), the P-type semiconductor layer (330) and the transparent electrode (340) are formed with a plurality of nano openings each opening communicating with a plurality of nano grooves (310a) formed on the N-type semiconductor layer (310).

Therefore, the light emitting device according to the first embodiment of the present invention is formed with the plurality of nano grooves (310a) that go through from the transparent electrode (340) to part of the N-type semiconductor layer (310).

FIGS. 7a to 7h are schematic cross-sectional views of fabricating process of a light emitting device according to a second embodiment of the present invention.

Figure 7A:
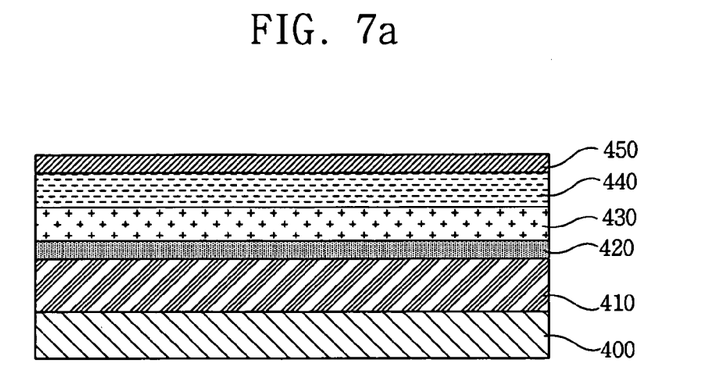
FIGS. 7a to 7h are schematic cross-sectional views of fabricating process of a light emitting device according to a second embodiment of the present invention.

First of all, a substrate (400) is stacked on an upper surface thereof with an N-type semiconductor layer (410), an active layer (420), a P-type semiconductor layer (430), a protective layer (440) and a thin mask film (450) (FIG. 7a)

Figure 7B:
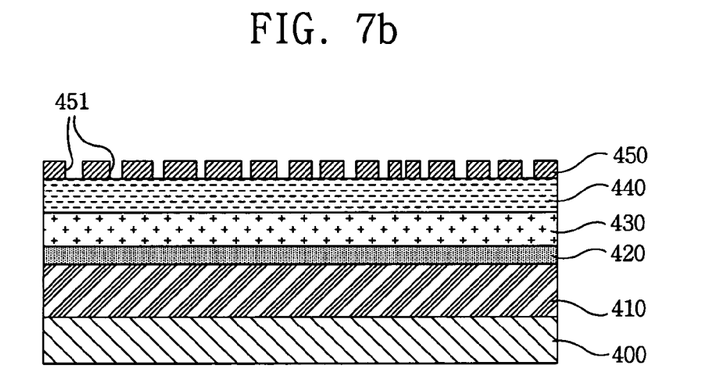
Figure 7C:
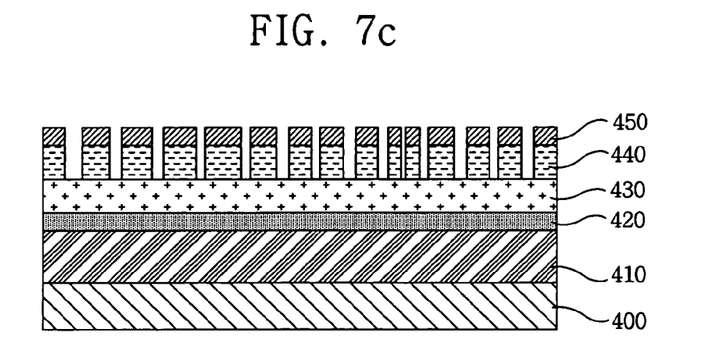
Figure 7D:
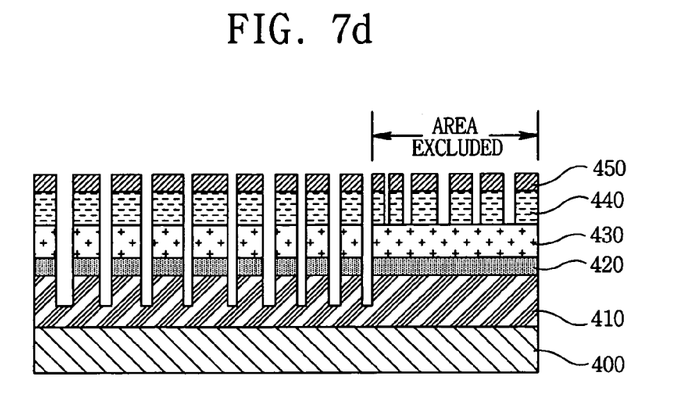
Figure 7E:
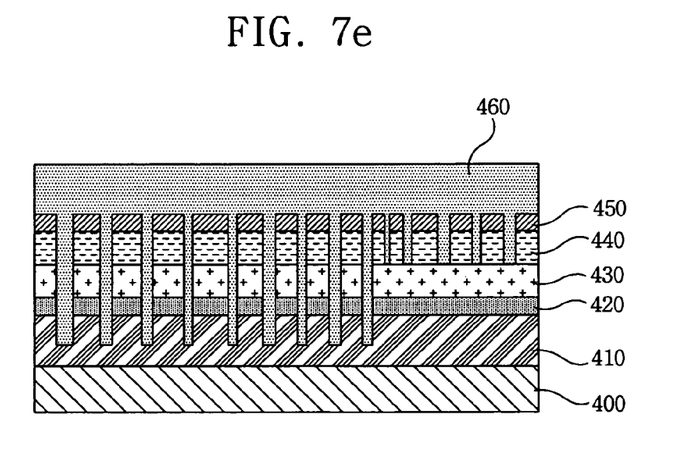

The thin mask film (450) is thermally treated to allow a plurality of nano openings (451) to be formed thereon, each opening being spaced a distance apart (FIG. 7b). The protective layer (440) exposed to the plurality of nano openings (451) is etched by the thin mask film (450) as a mask (FIG. 7c). An area of the thin mask film (450) is partially removed, and an etching is performed from the P-type semiconductor layer (430) exposed to the plurality of nano openings (451) to part of the N-type semiconductor layer (410) (FIG. 7d). The plurality of nano openings (451) are filled in and insulating filler (460) is coated on the thin mask film (450) (FIG. 7e).

Figure 7F:
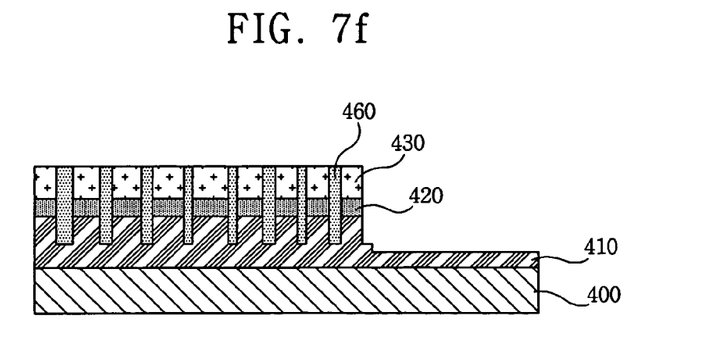
Figure 7G:
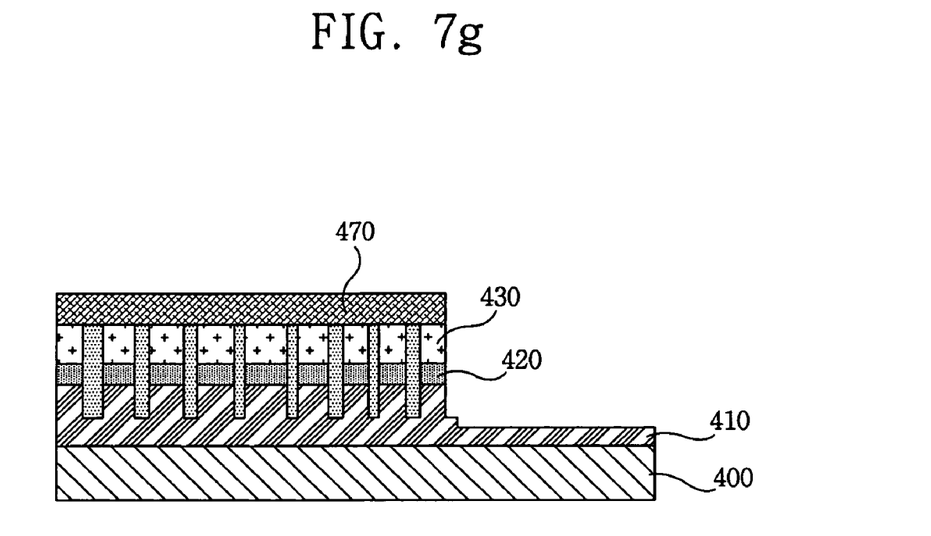

Successively, the insulating filler (460) at the excluded area, the thin mask film (450), the protective layer (440), the P-type semiconductor layer (430), the active layer (420) and part of the N-type semiconductor layer (410) are etched (FIG. 7f). The insulating filler (460) is preferred to be polyimide or spin-on glass (SOG). At this time, the exposed P-type semiconductor layer (430) is formed thereon with a transparent electrode (470) (FIG. 7g).

Figure 7H:
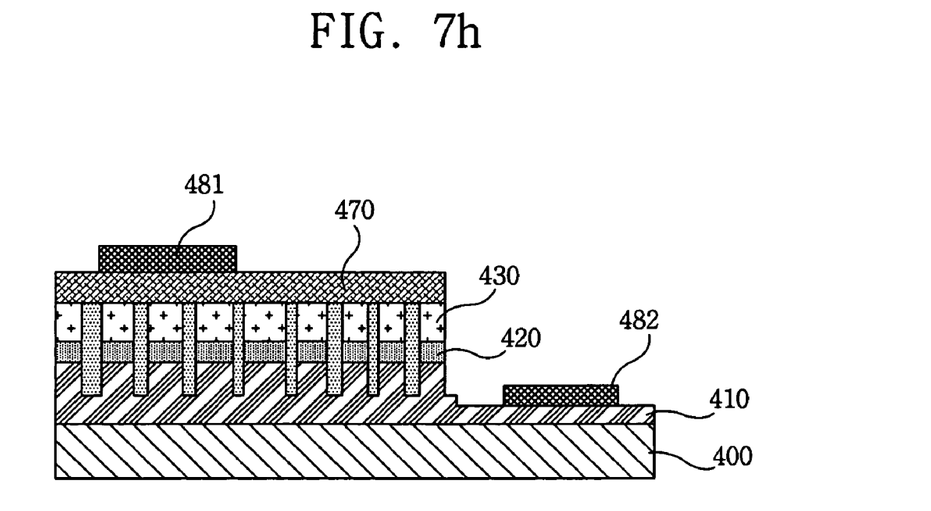

Lastly, the transparent electrode (470) is formed thereon with a P-type electrode (481), and the etched N-type semiconductor layer (410) is formed thereon with an N-type electrode (482) (FIG. 7h). In the aforementioned process, the N-type semiconductor layer (410) and the P-type semiconductor layer (430) may be switched in positions thereof.

Referring to FIG. 7h, once the above-mentioned processes are performed, the light emitting device according to the second embodiment of the present invention comprises: a substrate (400); an N-type semiconductor layer (410) formed on the substrate (400), part of the upper surface being removed and formed with a plurality of nano grooves at the upper surface thereof not removed; an active layer (420) formed on an upper surface area of non-removed N-type semiconductor layer (410), and having a plurality of nano openings, each opening communicating with the plurality of nano grooves; a P-type semiconductor layer (430) formed on the active layer (420), and having a plurality of nano openings, each opening communicating with the plurality of nano openings of the active layer (420); an insulating filler (460) filled into the nano grooves and the nano openings; a transparent electrode (470) formed on the P-type semiconductor layer (430) and the insulating filler (460); a P-type electrode (481) formed on the transparent electrode (470); and an N-type electrode (482) formed on an upper surface of the removed N-type semiconductor layer (410).

As a result, there is an advantage in the second embodiment of the present invention thus described in that a simple thermal treatment process enables a device formed with a plurality of nano grooves inside a light emitting structure to be fabricated, leading to an increase in a light emitting area, and enhancing a light extraction efficiency by way of reduction in totally reflected quantum and a manufacture yield by way of simplified and easy fabricating processes.

In other words, the nano openings and the nano grooves prevent the light emitted from the active layer of the LED from being totally reflected but allow being emitted outside, such that the light is not trapped inside the device to enhance the light extraction efficiency.

Meanwhile, a method for fabricating a light emitting device may comprise: preparing a light emitting structure composed of a first layer, an active layer and a second layer; forming a metal thin film on the second layer of the light emitting structure; performing a thermal treatment on the metal thin film to form a plurality of agglomerates; and using the plurality of agglomerates as a mask to etch at least a part of the light emitting structure.

At this time, the first layer is a layer having a first polarity, while the second layer has a polarity reversed from that of the first layer. Furthermore, the meaning of etching of at least part of the light emitting structure defines a whole area of unmasked light emitting structure being etched or partially being etched.

FIGS. 8a to 8h are schematic cross-sectional views of fabricating process of a light emitting device according to a third embodiment of the present invention.

Figure 8A:
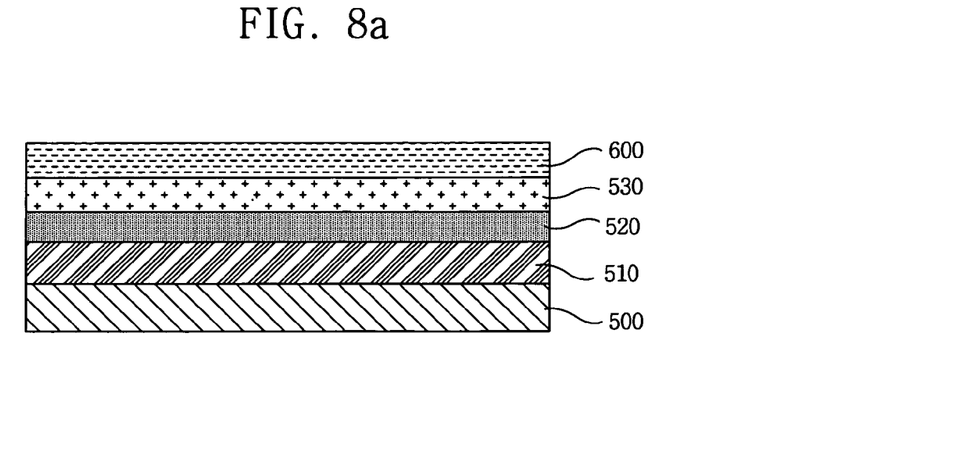
FIGS. 8a to 8h are schematic cross-sectional views of fabricating process of a light emitting device according to a third embodiment of the present invention.

A substrate (600) is sequentially stacked on an upper surface thereof with an N-type semiconductor layer (510), an active layer (520), a P-type semiconductor layer (530). The P-type semiconductor layer (530) is formed thereon with a conductive supporter (600) (FIG. 8a).

Preferably, the conductive supporter (600) is a metal layer deposited on the P-type semiconductor layer (530), or a conductive substrate joined to an upper surface of the P-type semiconductor layer (530) by a conductive adhesive.

Figure 8B:
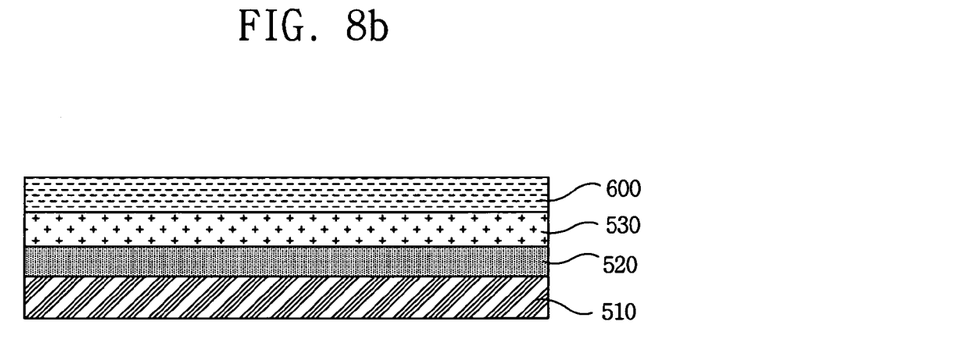
Figure 8C:
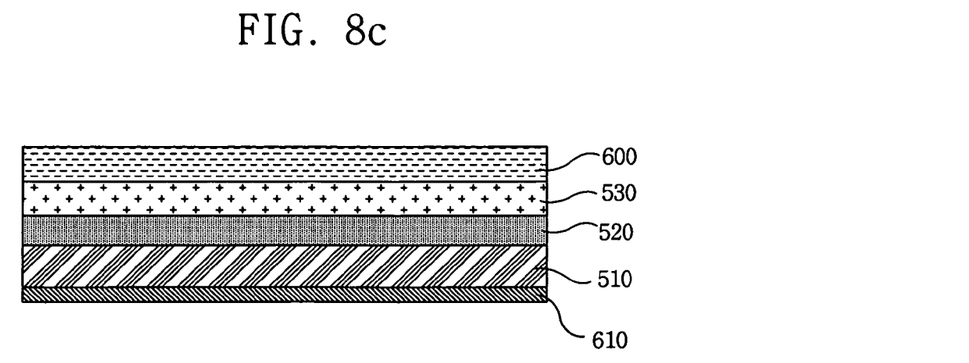

The substrate (500) is then separated from a bottom surface of the N-type semiconductor layer (510) (FIG. 8b). The separation of the substrate (500) is performed by an LLO (Laser Lift-Off) process in which laser beam is irradiated to the bottom surface of the N-type semiconductor layer (510) to separate the substrate (500). A thin film mask (610) is formed at a bottom surface of the N-type semiconductor layer (510) (FIG. 8c).

Figure 8D:
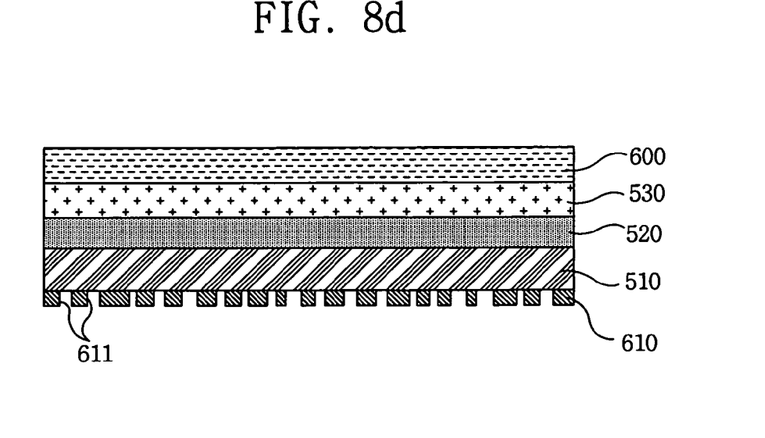
Figure 8E:
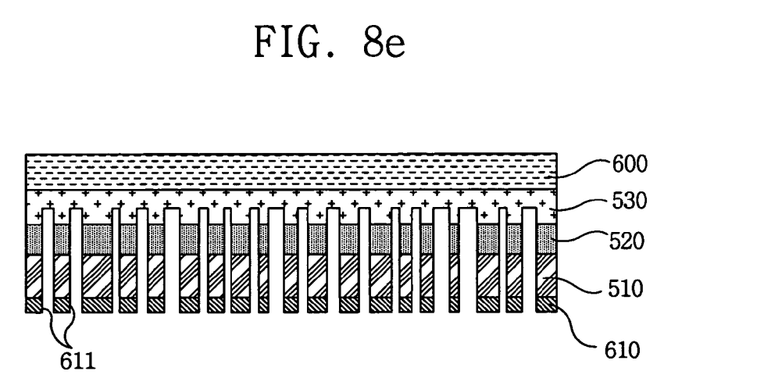
Figure 8F:
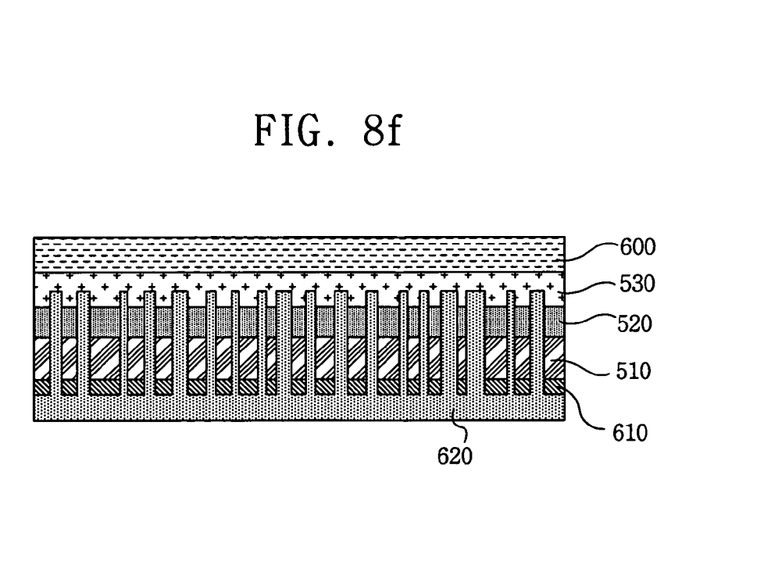

A thin mask film (610) is thermally treated to form a plurality of nano openings (611), each opening spaced a distance apart (FIG. 8d). An etching process is performed from the N-semiconductor layer (510) exposed to the plurality of nano openings (611) to a part of the P-type semiconductor layer (530) (FIG. 8e). The plurality of nano openings (611) are filled in and insulating filler (620) is coated on an upper surface of the thin mask film (610) (FIG. 8f).

Figure 8G:
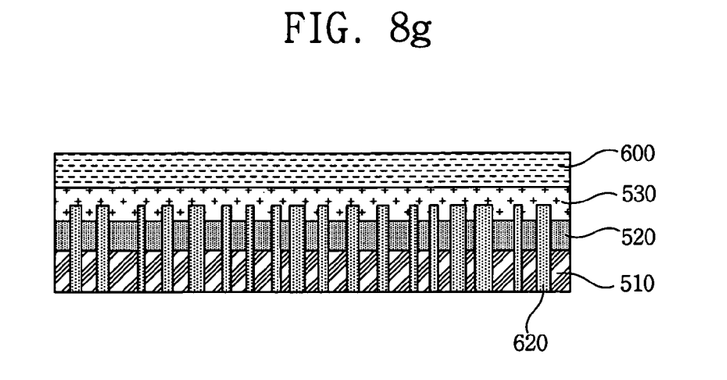
Figure 8H:
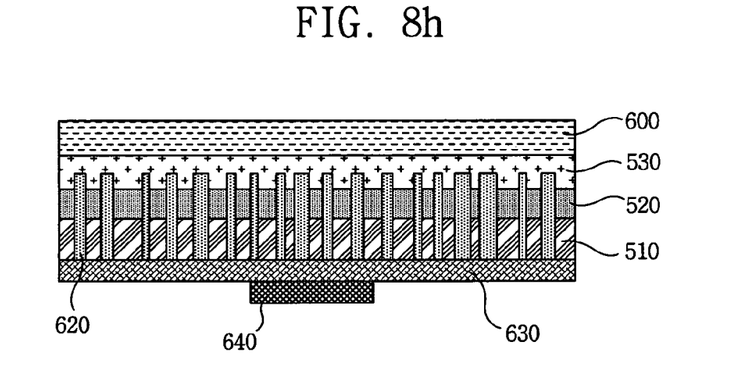

Successively, part of the insulating filler (620) and the thin mask film (610) are removed to allow a bottom surface of the N-type semiconductor layer (510) to be exposed (FIG. 8g). Lastly, the exposed N-type semiconductor layer (510) is formed at a bottom surface thereof with a transparent electrode (630), and the transparent electrode (630) is formed thereunder with an N-type electrode (FIG. 8h).

Figure 9:
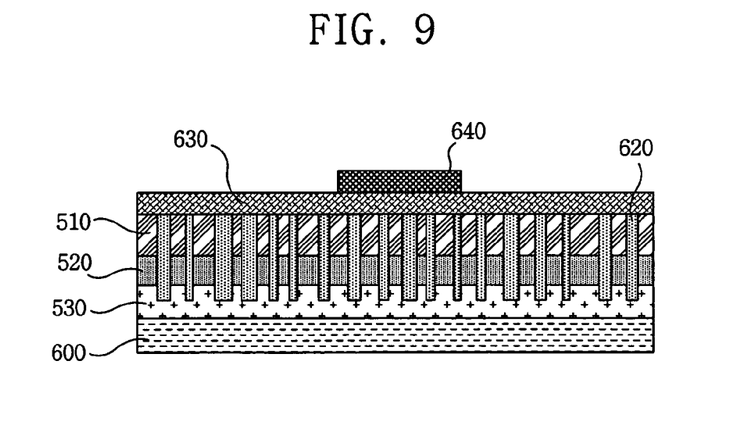
FIG. 9 is a cross-sectional view illustrating a light emitting device according to the third embodiment of the present invention.

FIG. 9 is a cross-sectional view illustrating a light emitting device according to the third embodiment of the present invention.

Referring again to FIG. 9, the light emitting device according to the third embodiment of the present invention comprises: a conductive supporter (600); a P-type semiconductor layer (530) formed on the conductive supporter (600) and formed with a plurality of nano grooves; an active layer (520) formed on the P-type semiconductor layer (530) and having a plurality of nano openings each opening communicating with the plurality of nano grooves; an N-type semiconductor layer (510) formed on the active layer (520), and having a plurality of nano openings, each opening communicating with the plurality of nano openings of the active layer (520); insulating filler (620) filled into the nano grooves and the nano openings; a transparent electrode (630) formed on the N-type semiconductor layer (510) and the insulating filler (620); and an electrode (640) formed on the transparent electrode (630).

Therefore, there is an advantage in the light emitting device thus described according to the third embodiment of the present invention in that the insulating filler is filled in each nano opening and nano groove to facilitate the stabilization of the device.

Figure 10A:
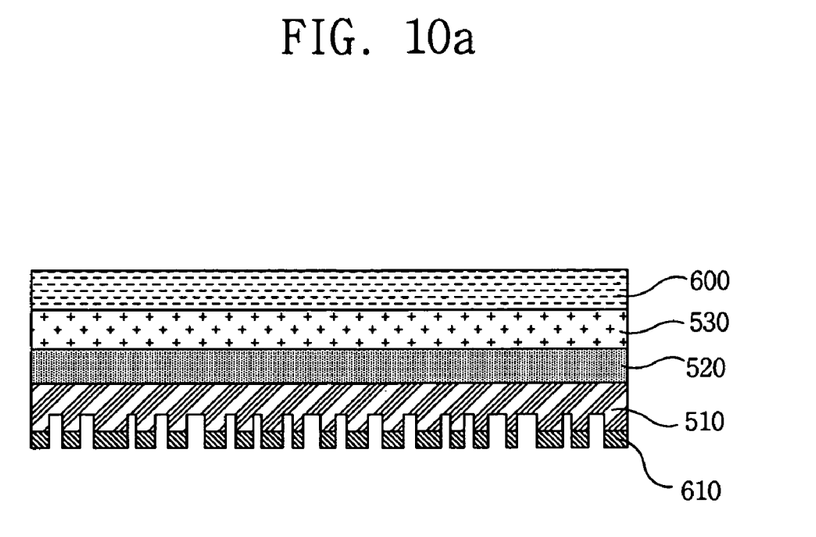
FIGS. 10a to 10b are cross-sectional views illustrating a fabricating process of a light emitting device by partially etching an N-semiconductor layer and forming a structure having nano grooves following the process of FIG. 8d.
Figure 10B:
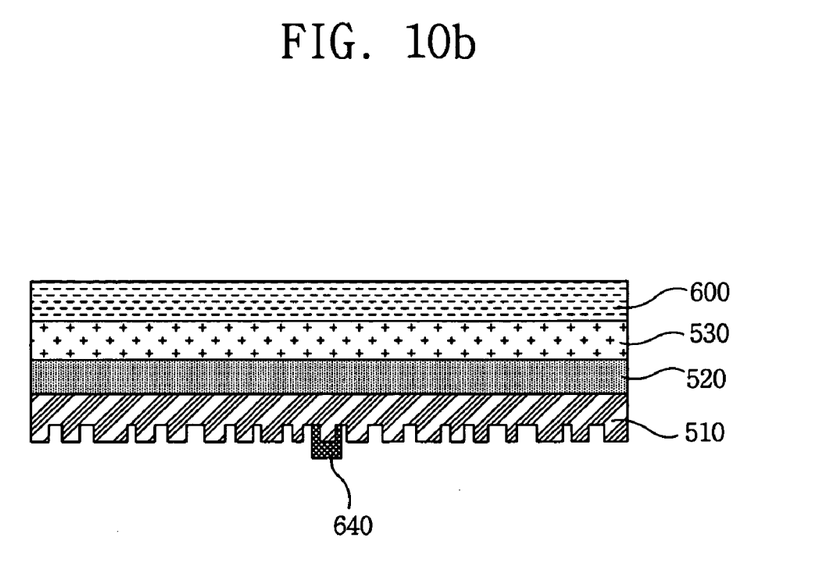

FIGS. 10a to 10b are cross-sectional views illustrating a fabricating process of a light emitting device by partially etching an N-semiconductor layer and forming a structure having nano grooves following the process of FIG. 8d.

Following the process of FIG. 8d, a part of the N-type semiconductor layer (510) is etched to form a plurality of nano grooves (511) by using the thin mask film (610) as a mask (FIG. 10a). Then, the thin mask film (610) is removed to form an N-type electrode (640) at a bottom surface of the N-type semiconductor layer (510) (FIG. 10b).

As a result, the light emitting device of FIG. 10b comprises: a conductive supporter (600); a P-type semiconductor layer (530) formed on the conductive supporter (600); an active layer (520) formed on the P-type semiconductor layer (530); an N-type semiconductor layer (510) formed on the active layer (520), and having a plurality of nano grooves; and an electrode (640) formed on the N-type semiconductor layer (510).

Figure 11:
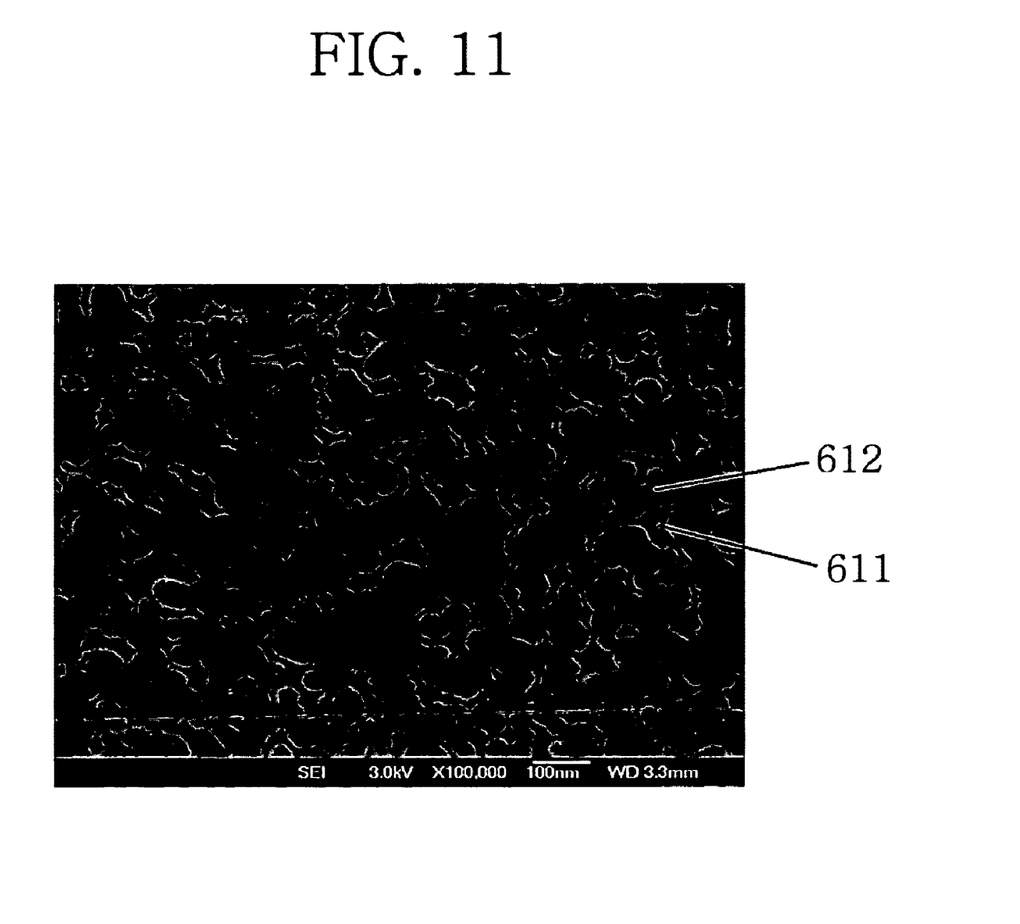
FIG. 11 is a photograph of a scanning electron microscope in which nano openings formed by agglomerates are photographed according to the present invention.

FIG. 11 is a photograph of a scanning electron microscope (SEM), in which nano openings formed by agglomerates, are photographed according to the present invention.

A thin mask film of 5 nm thickness composed of Cr at an upper surface of a base layer was formed, and a thermal treatment process was performed thereto for 3 minutes at 850° C. Agglomerates (612) as shown in FIG. 11 were formed, and the agglomerates (612) were interconnected to form nano openings (611) therein. It can be noted that the agglomerates (612) are formed in sizes different from each other.

It will be appreciated that, when the terms of "layers, films, areas, plates or parts" (to be referred to as elements) as used in this specification and the appended claims are formed or located ON the other elements, this implies to include not only a case where these elements are formed ON the other elements to directly contact therebetween, and but also a case where there exist other intermediaries in between these elements.

As apparent from the foregoing, there are advantages in the light emitting device having nano openings according to the present invention thus described in that a thin mask film is changed to agglomerates by a simple thermal treatment process, and a plurality of nano openings, each opening spaced a distance apart, are formed in the agglomerates, a light emitting structure exposed to the nano openings is etched to form nano grooves and nano openings therein, facilitating to increase a light emitting area and to reduce the totally reflected light for an improvement of the light extraction efficiency, whereas there were shortcomings in the conventional semiconductor processing technology in that a very precise photolithography technology was employed to fabricate nano structure associated with problems of poor manufacture yield and high system cost.

Another advantage is that nano openings and nano grooves of a light emitting structure are filled with insulating filler to enable to stabilize the LED structure and to improve the device reliability. Still another advantage is that a simple process is used to embody a vertical light emitting device and to reduce an operating voltage of the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting device, comprising: a substrate; a first layer having a first polarity, formed on the substrate, with part of the first layer being removed and a plurality of nano grooves formed at an area of the first layer not removed; an active layer formed on the first layer not removed, and formed with nano openings communicating with the nano grooves; a second layer formed on the active layer and having a reverse polarity from that of the first layer, and formed with nano openings communicating with the nano openings; a first electrode formed on the second layer; and a second electrode formed on the first layer that is removed, wherein a transparent electrode is interposed between the second layer and the first electrode and the transparent electrode is formed with a plurality of nano openings, each opening communicating with a plurality of nano grooves.

2. The device as defined in claim 1, wherein insulating filler is filled in the nano openings and the nano grooves, and a transparent electrode is formed on the second layer and the insulating filler.

3. The device as defined in claim 1, wherein the first polarity is an N-type.

4. A light emitting device, comprising: a supporter; a first layer having a first polarity, formed on the supporter, and with a plurality of nano grooves; an active layer formed on the first layer and having nano openings, each opening communicating with the plurality of nano grooves; a second layer having a polarity reverse of the first polarity, the second layer formed on the active layer and having nano openings, each opening communicating with the nano openings of the active layer; and an electrode formed on the second layer, wherein a transparent electrode is interposed between the second layer and the first electrode and the transparent electrode is formed with a plurality of nano openings, each opening communicating with a plurality of nano grooves.

5. The device as defined in claim 4, wherein insulating filler is filled in the nano openings and the nano grooves, and a transparent electrode is formed at an upper surface of the second layer and the insulating filler.

6. The device as defined in claim 5, wherein the insulating filler is polyimide or spin-on glass (SOG) material.

7. The device as defined in claim 4, wherein the supporter is a metal layer or a conductive substrate.

8. The device as defined in claim 4, wherein each width of the nano openings is in the range of 1~1000 nm.

* * * * *